United States Patent
Seo et al.

(10) Patent No.: US 12,040,792 B2
(45) Date of Patent: Jul. 16, 2024

(54) PROXIMITY SENSOR WITH INTERNAL TEMPERATURE SENSOR AND METHOD OF OPERATING THE SAME

(71) Applicant: ABOV Semiconductor Co., Ltd., Cheongju-si (KR)

(72) Inventors: Young Jin Seo, Seoul (KR); Seo Han Lee, Seoul (KR); Yoon Ki Kim, Seoul (KR); Yeong Jin Mun, Seoul (KR)

(73) Assignee: ABOV SEMICONDUCTOR CO., LTD., Cheongju-si (KR)

( * ) Notice: Subject to any disclaimer, the term of this patent is extended or adjusted under 35 U.S.C. 154(b) by 47 days.

(21) Appl. No.: 18/090,283

(22) Filed: Dec. 28, 2022

(65) Prior Publication Data

US 2023/0216496 A1 Jul. 6, 2023

(30) Foreign Application Priority Data

Dec. 30, 2021 (KR) ........................ 10-2021-0192514

(51) Int. Cl.
*H03K 17/95* (2006.01)
*G01D 3/036* (2006.01)
*G06F 3/041* (2006.01)
*H03K 17/955* (2006.01)

(52) U.S. Cl.
CPC ....... *H03K 17/9545* (2013.01); *G01D 3/0365* (2013.01); *G06F 3/0418* (2013.01); *H03K 17/9532* (2013.01); *H03K 17/955* (2013.01)

(58) Field of Classification Search
CPC ............. H03K 17/9545; H03K 17/955; H03K 17/9532; G01D 3/0365; G06F 3/0418

USPC ................... 702/99; 73/708, 753, 723, 717; 340/566; 331/65

See application file for complete search history.

(56) References Cited

U.S. PATENT DOCUMENTS

| | | | | |
|---|---|---|---|---|
| 4,845,464 A | * | 7/1989 | Drori ................... | G08B 29/185 73/DIG. 1 |
| 8,395,396 B2 | * | 3/2013 | Hagleitner ........... | A47K 5/1217 73/862.626 |

FOREIGN PATENT DOCUMENTS

| | | |
|---|---|---|
| KR | 10-2013-0070953 A | 6/2013 |
| KR | 10-2020-0131524 A | 11/2020 |
| KR | 10-2234612 B1 | 4/2021 |

(Continued)

*Primary Examiner* — Arnold M Kinkead
(74) *Attorney, Agent, or Firm* — WTA Patents

(57) ABSTRACT

A proximity sensor is provided with multiple channels and a proximity sensor chip (IC) connected to the multiple channels through a sensing line. The proximity sensor chip (IC) includes an internal temperature sensor, senses a first sensing value through the multiple channels, senses a second sensing value through the internal temperature sensor, and compensates the first sensing value through addition or subtraction of the second sensing value with respect to the first sensing value. The internal temperature sensor includes: a clock signal generator including a first oscillator and generating first clock signals variable according to temperature characteristics; and a temperature compensator generating second clock signals according to a setting condition corresponding to the first clock signals generated from the clock signal generator and outputting the second sensing value by counting the second clock signals through a second oscillator generating reference clock signals independent of temperature change.

9 Claims, 7 Drawing Sheets

(56) References Cited

FOREIGN PATENT DOCUMENTS

KR  10-2252572  B1  5/2021

\* cited by examiner

PROXIMITY SENSOR WITH INTERNAL TEMPERATURE SENSOR AND METHOD OF OPERATING THE SAME

CROSS-REFERENCE TO RELATED APPLICATIONS

This application claims priority to Republic of Korea Patent Application No. 10-2021-0192514, filed on Dec. 30, 2021, which is incorporated by reference herein in its entirety.

TECHNICAL FIELD

The present invention relates to a proximity sensor having an internal temperature sensor and a method of operating the same. More particularly, the present invention relates to a proximity sensor that includes a proximity sensor chip (IC) having an internal temperature sensor and can secure more accurate proximity sensing through temperature compensation of a sensing value of the proximity sensor using the internal temperature sensor while reducing deviation between temperature change slopes of IC chips, and a method of operating the same.

BACKGROUND

With development of information communication technology, network devices including base stations and the like have been installed all over the country and electronic devices may send and receive data to and from other electronic devices through networks to allow users to freely use the networks anywhere in the country.

Various types of electronic devices provide various functions according to a recent trend of digital convergence. For example, smartphones are used for making calls and support an Internet access function through the network, a function of playing music or video, and a function of taking pictures and videos using an image sensor.

As users carry electronic devices having various functions, a proximity sensor (GRIP sensor; proximity; SAR sensing) is additionally used to manage harmful electromagnetic waves that can be generated from the electronic devices.

Conventionally, there is a problem in that a sensing value changes according to temperature, thereby causing generation of malfunctions due to an erroneous determination as to whether or not to grip in a long-term grip detection zone.

Moreover, as shown in FIGS. 1A and 1B, a conventional ADC based temperature sensor requires a high resolution ADC for improvement in resolution of the temperature sensor. Specifically, the conventional ADC based temperature sensor is composed of a bandgap reference (BGR) circuit, an OPAMP and a 12-bit ADC, as shown in FIG. 1(a), or is composed of a BRG circuit and a 16-bit DSADC, as shown in FIG. 1(b), and thus has a problem of essential use of the high resolution ADC.

Moreover, in a SET structure in which an IC is placed near a heat source, despite insignificant temperature change of SAR and REF channels, rapid change in temperature around the IC makes it difficult to achieve accurate compensation of REF in the REF channel and compensation is difficult when multiple sensing channels are present together with only one REF.

Therefore, there is a need for a proximity sensor adopting a suitable temperature compensation method in order to solve the problems as described above.

SUMMARY

Embodiments of the present invention are conceived to solve such problems in the art and it is one aspect of the present invention to provide a proximity sensor having an internal temperature sensor, which can achieve more accurate proximity sensing through temperature compensation with respect to a sensing value of the proximity sensor using the internal temperature sensor, and a method of operating the same.

It is another aspect of the present invention to provide a proximity sensor having an internal temperature sensor, in which an IC chip having an internal temperature sensor is disposed near a reference-free channel to perform temperature compensation using the internal temperature sensor while allowing temperature compensation with respect to a distant channel through a reference channel, and is placed at a location not generating heat in the IC structure to perform more accurate temperature compensation through acquisition of only external temperature data in a structure including multiple sensing channels, and a method of operating the same.

It is a further aspect of the present invention to provide a proximity sensor having an internal temperature sensor, in which an MCU is provided with a small ring oscillator without significant increase in area of a gate of the temperature sensor to increase resolution of the temperature sensor by implementing high-resolution temperature data through adjustment in sensing time, and a method of operating the same.

Embodiments of the present invention provide a proximity sensor having an internal temperature sensor and a method of operating the same.

In one embodiment, there is provided a method of operating a proximity sensor provided with multiple channels reacting to user contact and a proximity sensor chip (IC) connected to the multiple channels through a sensing line and including an internal temperature sensor, the method including the steps of: sensing a first sensing value through the multiple channels; sensing a second sensing value through the internal temperature sensor; and compensating the first sensing value through addition or subtraction of the second sensing value with respect to the first sensing value, wherein the step of sensing a second sensing value includes generating first clock signals variable according to temperature characteristics through a first oscillator of the internal temperature sensor; generating second clock signals at time intervals set according to a setting condition corresponding to the first clock through a timer of the internal temperature sensor; generating third clock signals independent of temperature change through a second oscillator of the internal temperature sensor, followed by counting the second clock signals using the third clock signals through the counter of the internal temperature sensor; capturing a counted value with reference to the second clock signals to send the counted value through a buffer, the counted value being obtained by counting the second clock signals; and outputting the value received from the buffer, and the output value is the second sensing value.

In one embodiment, there is provided a proximity sensor provided with multiple channels reacting to user contact and a proximity sensor chip (IC) connected to the multiple channels through a sensing line, wherein the proximity sensor chip (IC) includes an internal temperature sensor, senses a first sensing value through the multiple channels, senses a second sensing value through the internal temperature sensor, and compensates the first sensing value through addition or subtraction of the second sensing value with respect to the first sensing value; and wherein the internal temperature sensor includes: a clock signal generator including a first oscillator and generating first clock signals variable according to temperature characteristics; and a temperature compensator generating second clock signals according to a setting condition corresponding to the first clock signals generated from the clock signal generator and outputting the second sensing value by counting the second clock signals through a second oscillator generating reference clock signals independent of temperature change.

The first oscillator may be a ring oscillator.

A frequency of the first clock signals generated from the first oscillator may increase upon relative increase in sensed temperature and may decrease upon relative decrease in sensed temperature.

The clock signal generator may further include a current trimming DAC to adjust a frequency of the first clock signal generated from the first oscillator according to the quantity of electric current through the current trimming DAC.

The temperature compensator may include: a timer outputting the second clock signals at various time intervals according to the setting condition corresponding to the first clock signals generated from the first oscillator; a counter counting the second clock signals using third clock signals generated through the second oscillator to output a counted value; a capture buffer capturing the counted value output through the counter with reference to the second clock signals to send the counted value; and a timer data collector collecting the value captured by the capture buffer, and may perform temperature compensation based on a value output through the timer data collector.

One of the multiple channels may be provided with a reference to perform temperature compensation and the proximity sensor chip (IC) including the internal temperature sensor may be disposed near a channel not provided with the reference to perform temperature compensation.

The internal temperature sensor may be disposed at a distal end portion of the proximity sensor chip (IC), around which an circuitry acting as a heat source is not disposed, so as to face a location where temperature will be measured.

A sensing value of the proximity sensor compensated through the internal temperature sensor may be further compensated for an environmental change through the reference.

According to the embodiments of the invention, the proximity sensor having an internal temperature sensor can achieve more accurate proximity sensing through temperature compensation with respect to a sensing value of the proximity sensor using the internal temperature sensor.

In addition, according to the embodiments of the invention, for multiple sensing channels, the proximity sensor chip (IC) including an internal temperature sensor is disposed near a reference-free channel, that is, at a location generating no heat in the IC structure, to perform temperature compensation using the internal temperature sensor while allowing temperature compensation with respect to a distant channel using a reference channel, thereby enabling more accurate temperature compensation based only on external temperature data.

In addition, according to the embodiments of the invention, an MCU is provided with a small ring oscillator without significant increase in area of a gate of the temperature sensor to improve resolution of the temperature sensor by implementing temperature data with high resolution through adjustment in sensing time.

BRIEF DESCRIPTION OF THE DRAWINGS

The above and other aspects, features, and advantages of the present invention will become apparent from the detailed description of the following embodiments in conjunction with the accompanying drawings.

DETAILED DESCRIPTION OF EMBODIMENTS

Hereinafter, embodiments of the present invention will be described with reference to the accompanying drawings. The accompanying drawings are included to provide a further understanding of the present invention, and are incorporated in and constitute a part of the specification, illustrate exemplary embodiments of the present invention, and together with the description serve to explain the principles of the present invention. However, it should be understood that the present invention is not limited to a certain drawing and features disclosed in each drawing may be combined with features in other drawings to constitute a novel embodiment.

It should be understood that the present invention is not limited to the following embodiments and may be embodied in different ways, and that the embodiments are provided for complete disclosure and thorough understanding of the present invention by those skilled in the art. The scope of the present invention is defined only by the claims.

In addition, description of known functions and constructions, which may unnecessarily obscure the subject matter of the present invention, will be omitted.

Figure 1A:
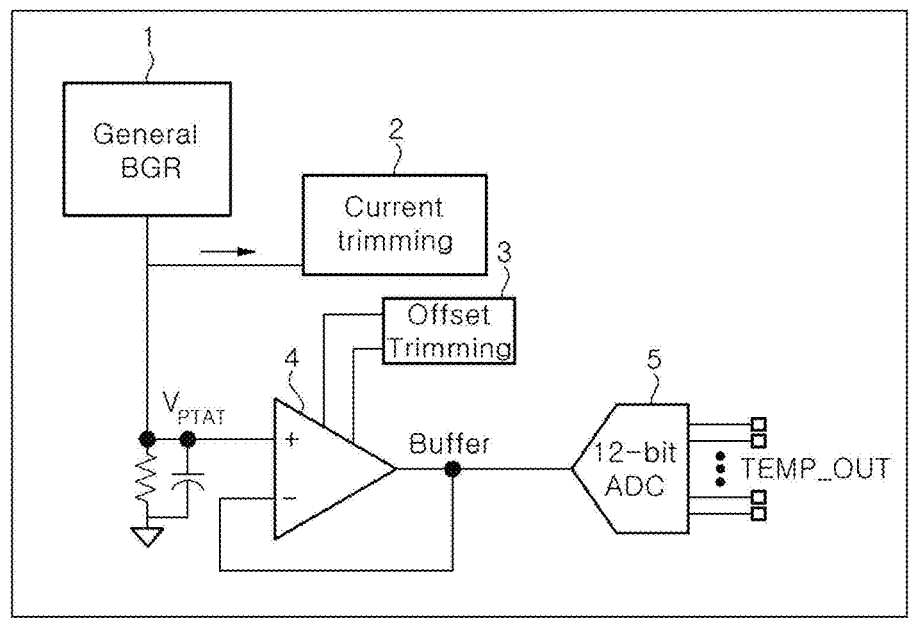
FIGS. 1A and 1B are circuit diagrams of a conventional temperature sensor.
Figure 1B:
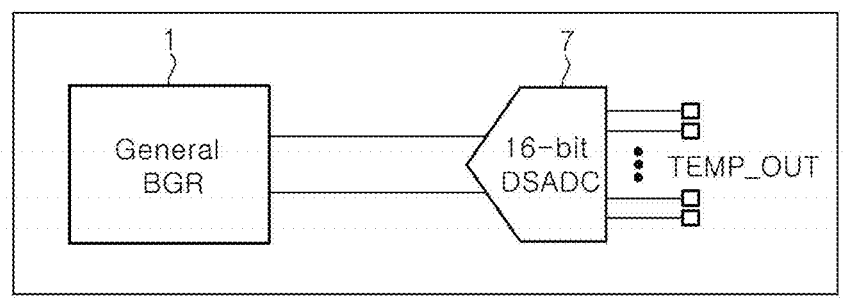
Figure 2:
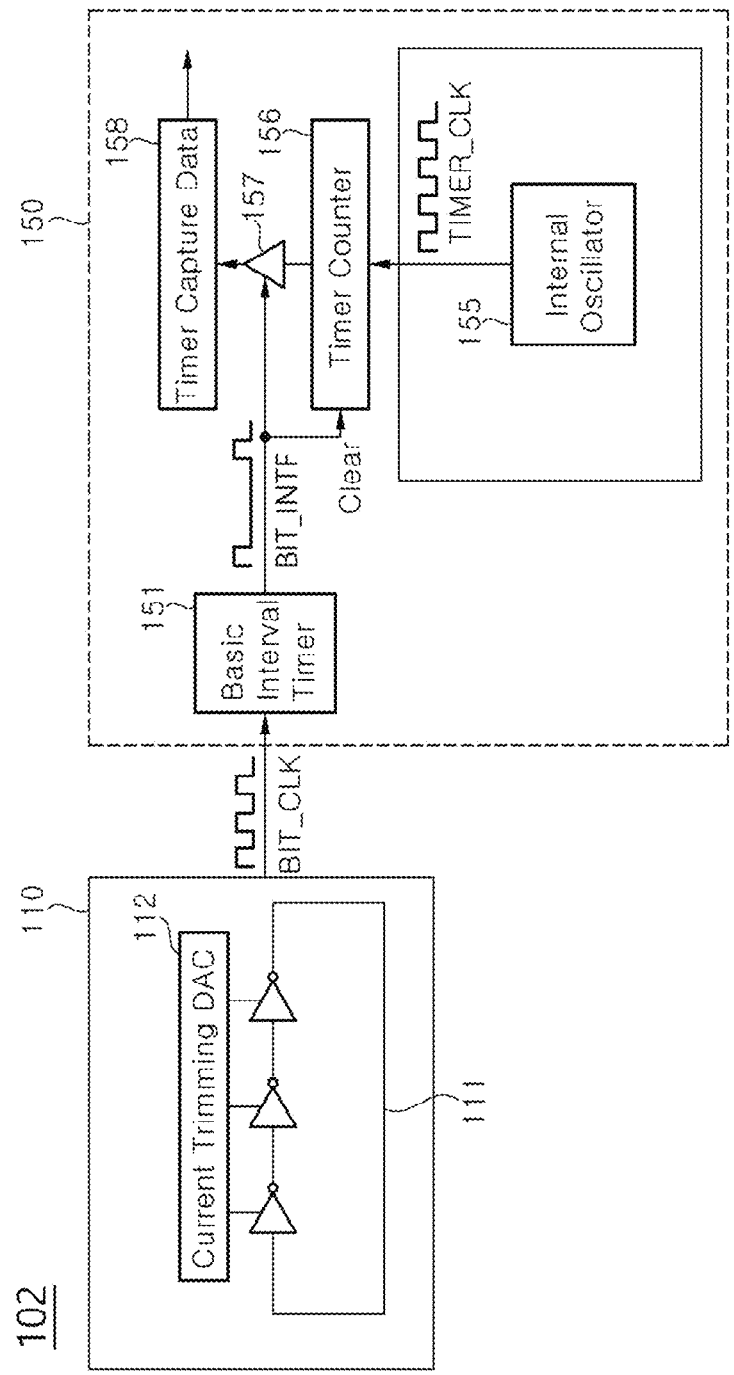
FIG. 2 is a diagram of an internal temperature sensor according to one embodiment of the present invention.
Figure 3A:
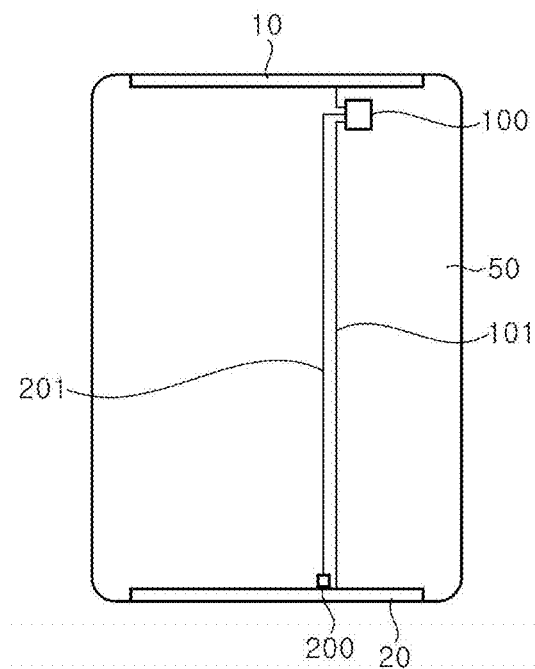
FIGS. 3A and 3B are views illustrating arrangement of a reference and a proximity sensor chip (IC) having an internal temperature sensor according to one embodiment of the present invention.
Figure 3B:
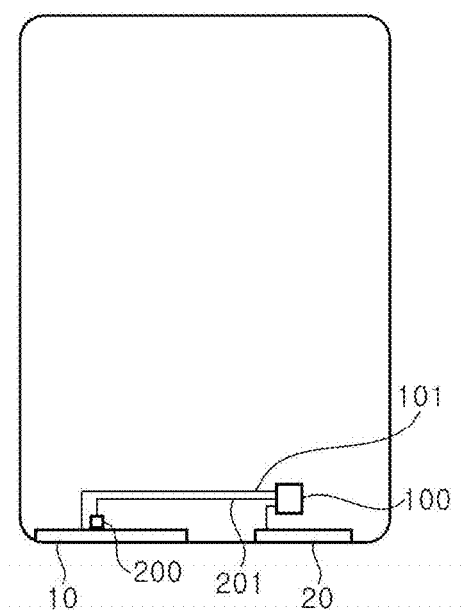
Figure 5:
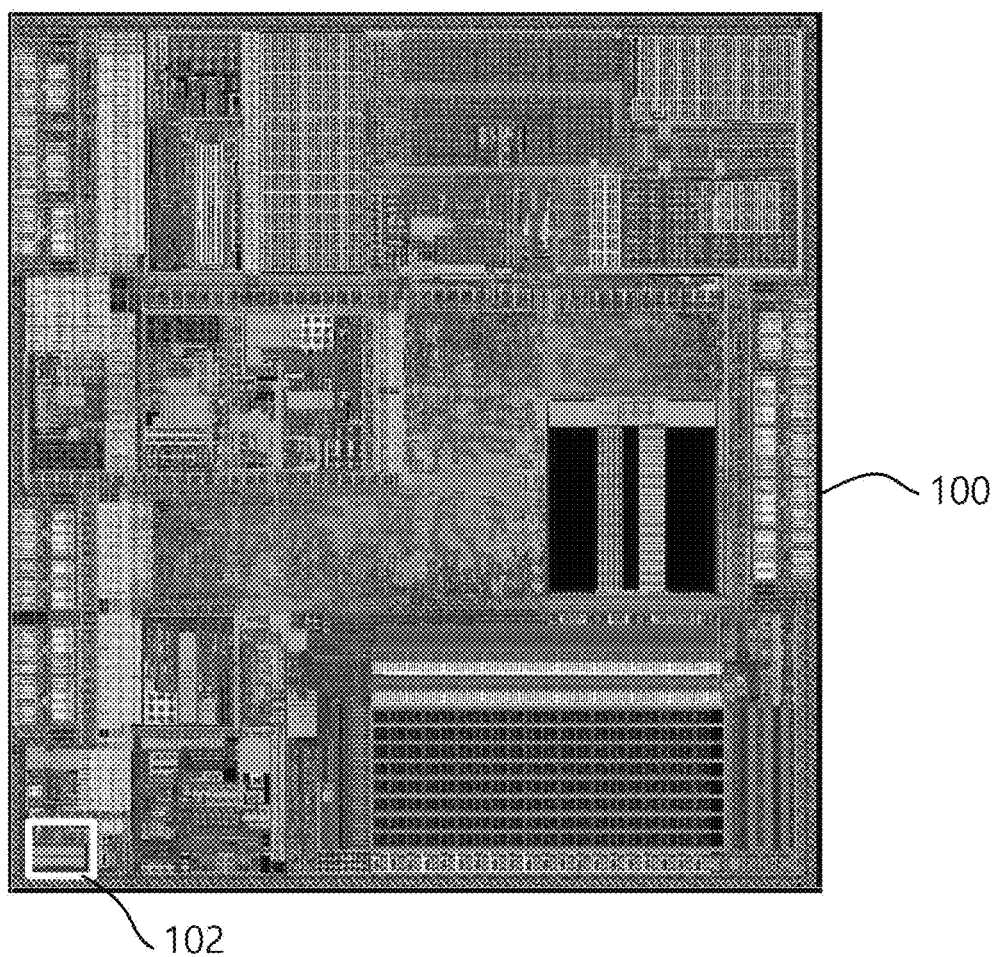
FIG. 5 is a view of a proximity sensor chip (IC) having an internal temperature sensor according to one embodiment of the present invention.
Figure 6:
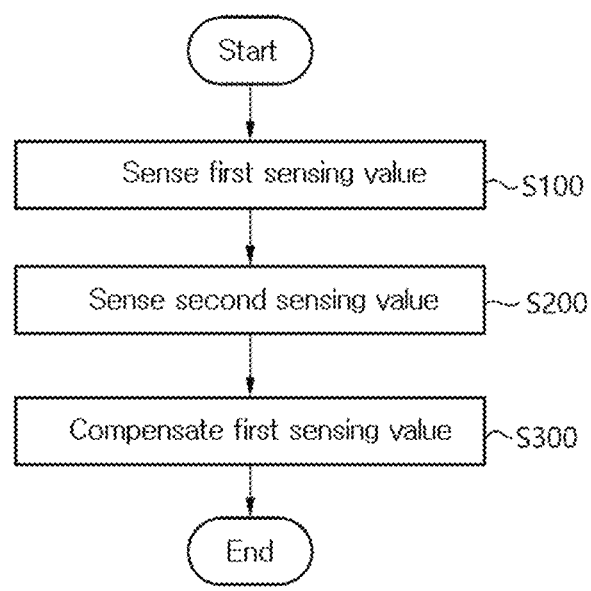
FIGS. 6 and 7 are flowcharts illustrating a method of operating a proximity sensor having an internal temperature sensor according to one embodiment of the present invention.
Figure 7:
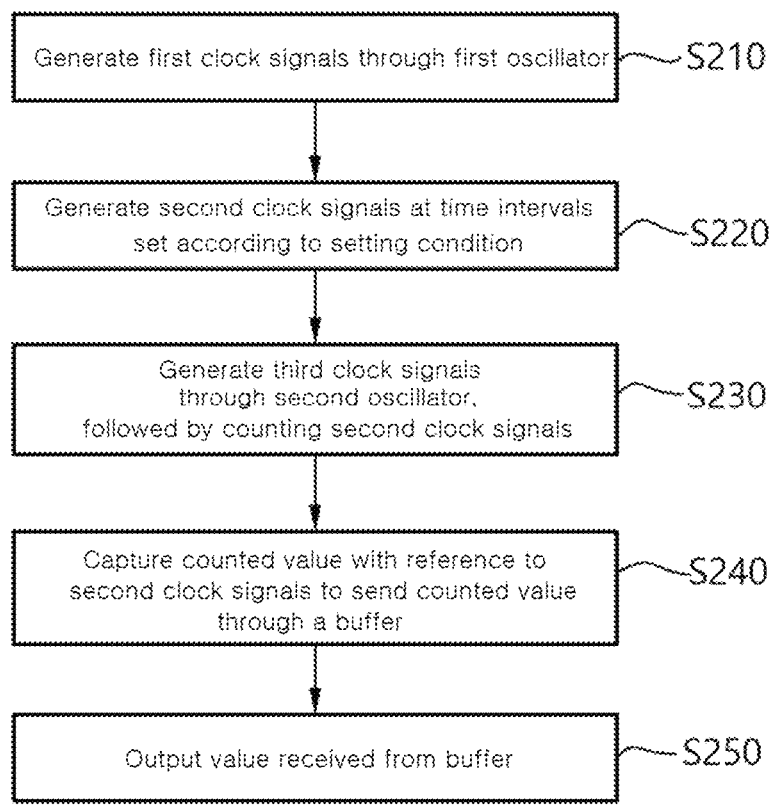

FIG. 2 is a diagram of an internal temperature sensor according to one embodiment of the present invention; FIGS. 3A and 3B are views illustrating arrangement of a reference and a proximity sensor chip (IC) having an internal temperature sensor according to one embodiment of the present invention; FIG. 4 is graphs depicting concepts of adjustment in deviation between ICs through adjustment in frequency of clock signals generated from a first oscillator according to the quantity of electric current through a current trimming DAC according to the present invention; FIG. 5 is a view of a proximity sensor chip (IC) having an internal temperature sensor according to one embodiment of the present invention; and FIG. 6 and FIG. 7 are flowcharts illustrating a method of operating a proximity sensor having an internal temperature sensor according to one embodiment of the present invention.

Referring to FIG. 2 to FIG. 5, a proximity sensor having an internal temperature sensor according to one embodiment of the present invention is provided to an electronic device 50 having an RF function and may include multiple channels 10, 20 reacting to user contact, a proximity sensor chip (IC) 100 connected to the multiple channels 10, 20 through a sensing line 101, and a reference 200 connected to the proximity sensor chip 100 through a reference sensing line 201 to compensate for temperature.

The proximity sensor chip 100 may be provided with an internal temperature sensor 102. The internal temperature sensor 102 may include a clock signal generator 110 and a temperature compensator 150.

The proximity sensor chip 100 may sense a first sensing value, for example, a proximity sensing value, through the multiple channels and a second sensing value, for example, a temperature variation, through the internal temperature sensor.

Accordingly, the proximity sensor chip 100 may sense the first sensing value through the multiple channels 10, 20 and the second sensing value through the internal temperature sensor 102, and may compensate the first sensing value through addition or subtraction of the second sensing value with respect to the first sensing value.

Herein, compensation is performed to remove change in a proximity sensing value due to temperature change and may refer to a procedure for removing an effect of change in the proximity sensing value due to temperature change.

The internal temperature sensor 102 includes: a clock signal generator 110 provided with a first oscillator 111 and generating first clock signals variable according to temperature characteristics; and a temperature compensator 150 provided with a second oscillator 115 and generating second clock signals according to a setting condition corresponding to the first clock signals generated from the clock signal generator 110 and outputting a second sensing value by counting the second clock signals through the second oscillator 155 generating reference clock signals independent of temperature change.

More specifically, as shown in FIG. 2, the internal temperature sensor 102 may include: the clock signal generator 110 provided with the first oscillator 111 and generating first clock signals BIT CLK variable according to temperature characteristics; and the temperature compensator 150 provided with the second oscillator 115, which generates reference clock signals TIMER_CLK independent of variation in temperature, and outputting second clock signals BIT_INTF according to the setting condition corresponding to the first clock signals generated from the clock signal generator 110 and compensating for temperature of the second clock signals by counting the output second clock signals BIT_INTF through the second oscillator 155.

The clock signal generator 110 includes a first oscillator 111 and a current trimming DAC 112.

The first oscillator 111 may be a ring oscillator.

In addition, in an IC manufacturing process, data evaluating the temperature characteristics of the first oscillator 111, which is the ring oscillator of an IC, may be recorded in a memory section and the current trimming DAC 112 may be set based on the data to reduce deviation between temperature change slopes of all ICs.

Further, the internal temperature sensor according to the present invention may employ an internal OSC (corresponding to the second oscillator) and a timer logic (corresponding to the timer), which are implemented in a typical MCU, and may be realized to have a size 1/10 or more times smaller than a typical ADC-based temperature sensor through addition of a small ring oscillator.

Further, the first oscillator 111 may be realized by multiple inverters connected to each other in series to form a closed loop, in which the inverters may be provided in an odd number.

That is, the frequency of the first clock signals BIT_CLK of the first oscillator 111 may increase upon relative increase in the detected temperature and may decrease upon relative decrease in the detected temperature, and may be adjusted according to the quantity of electric current through the current trimming DAC 112.

The temperature compensator 150 may include: a timer 151 outputting the second clock signals BIT_INTF at various time intervals according to the setting condition corresponding to the first clock signals BIT_CLK generated from the first oscillator 111; a counter 156 counting the second clock signals using third clock signals TIMER_CLK generated through the second oscillator 155 to output a counted value; a capture buffer 157 capturing the counted value output through the counter 156 with reference to the second clock signals BIT_INTF to send a captured value in which the third clock signals are counted; and a timer data collector 158 collecting the value captured by the capture buffer, and may perform temperature compensation based on data output through the timer data collector 158.

According to the present invention, the internal temperature sensor facilitates temperature compensation by increasing resolution to create temperature data with large changes. For example, if the data of the temperature sensor changes by 1 count/1 degree when GRIP DATA changes by 10 count/1 degree, it is difficult to achieve temperature compensation due to insignificant change of the data of the temperature sensor.

According to the present invention, when the data of the temperature sensor changes sufficiently by 100 counts/1 degree, temperature compensation can be realized by processing the data.

The data may be processed by changing the period of the timer (BIT: Basic Interval Timer).

As a method for improvement in resolution, when the temperature sensor is implemented using a general ADC, resolution of the temperature sensor is determined by ADC resolution.

However, according to the present invention, when a value is generated using a change in clock due to temperature change as a counter, sufficient resolution can be obtained according to a set time.

For example, if a clock generated by the temperature sensor is sufficiently divided to create a BIT logic of 1 second intervals and counted with a 1 MHz OSC, a resolution of about 1,000,000 can be obtained to generate a 20-bit ADC output.

Further, as a method of reducing IC deviation, when circuitry is implemented and applied to an actual chip, deviation between samples occurs. Thus, there is a need to solve this problem for accurate application.

Since a frequency difference generated in use of an RC delay caused by temperature change is converted into temperature in this method, it is necessary to allocate different variables to samples such that the same output can be generated at the same temperature in order to reduce the deviation between the samples.

Although there is a method of trimming using an option for changing a mode R or C corresponding to the RC delay, this method requires switches for determining trimming and these switches also have components of the modes R and C, thereby making it difficult to achieve a constant scale (binary weighing).

However, according to the present invention, the frequency may be adjusted according to the quantity of electric current using a current source through the current trimming DAC 112 and the quantity of electric current is not changed by the switches, thereby enabling more accurate control.

Accordingly, when the temperature change of the REF channel is insignificant compared to the temperature change of a grip channel, it is possible to achieve temperature compensation using a temperature sensor through additional compensation or substitution.

Accordingly, a clock BIT_CLK generated based on clock signals created by the first oscillator (ring oscillator), which changes according to temperature, is input to the timer (BIT: Basic Interval Timer) logic, and the timer 151 outputs clocks at various intervals according to the set condition, thereby enabling implementation of high resolution and various time interval settings.

When the interval of the output clocks BIT_INTF is counted using the second oscillator 155 independent of temperature, the counted value becomes temperature data.

In addition, in the proximity sensor having the internal temperature sensor, as shown in FIGS. 3A and 3B, one of the multiple channels 10, 20 may be provided with a reference 200 to perform temperature compensation and the proximity sensor chip 100 including the internal temperature sensor may be disposed near a channel not provided with the reference 200 to perform temperature compensation.

Accordingly, the proximity sensor chip IC according to the present invention can realize a high resolution temperature sensor without deviation and can achieve more efficient measurement of temperature change caused by external factors through the internal temperature sensor therein.

Further, the internal temperature sensor 102 may replace compensation of the REF channel or may additionally compensate REF data.

That is, in use of the multiple channels, the proximity sensor chip (IC) may be disposed near a reference-free channel to perform temperature compensation through the internal temperature sensor and a reference channel may be used to perform temperature compensation with respect to a distant channel.

Further, proximity sensor data may be compensated through the internal temperature sensor and may be further compensated through the reference channel.

Additional compensation for environmental changes (for example, humidity, noise or dust of the proximity sensor, and the like) may be performed using the reference channel near a proximity sensor channel other than the channel where the internal temperature sensor is placed.

Figure 4A:
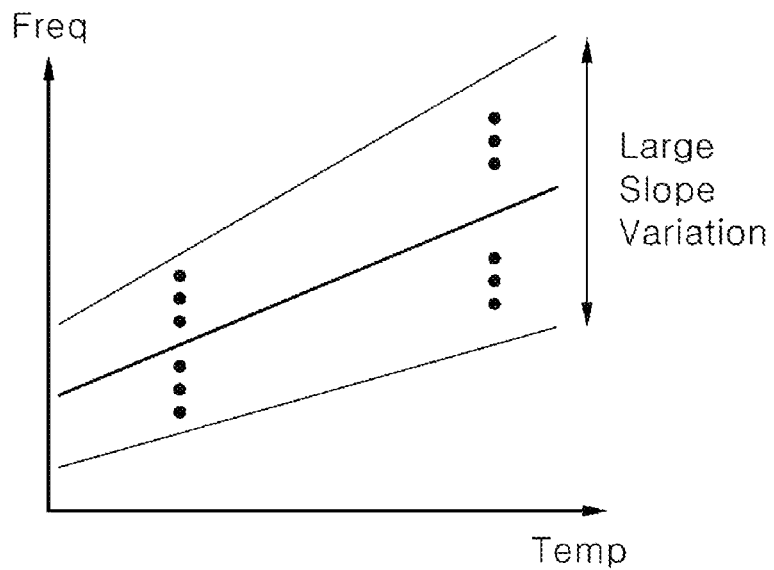
FIGS. 4A and 4B are graphs depicting concepts of adjustment in deviation between ICs through adjustment in frequency of clock signals generated from a first oscillator according to the quantity of electric current through a current trimming DAC according to the present invention.
Figure 4B:
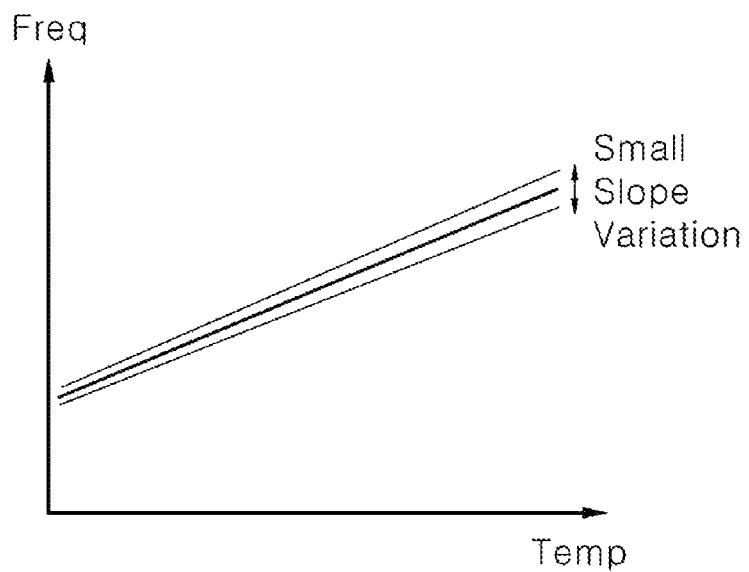

FIG. 4A is a graph depicting output characteristics of a conventional temperature sensor upon temperature change around the temperature sensor and FIG. 4B is a graph depicting output characteristics of the temperature sensor according to the present invention upon temperature change around the temperature sensor.

The conventional temperature sensor can cause a large deviation between temperature change slopes of ICs depending on characteristics of the ICs, whereas the temperature sensor according to the present invention can reduce deviation between the temperature change slopes of the ICs through the current trimming DAC by adjusting the frequency of the clock signals generated from the first oscillator according to the quantity of electric current.

Further, the proximity sensor according to the present invention may increase resolution of the temperature sensor through implementation of high-resolution temperature data by adding a small ring oscillator (ring OSC) to the MCU and adjusting the sensing time without significant increase in area of the gate of the temperature sensor, whereby the temperature sensor can increase the resolution using a smaller area than an area used by the conventional temperature sensor to increase the resolution.

Further, as shown in FIG. 5, the internal temperature sensor 102 of the proximity sensor according to the present invention may be disposed at a distal end portion of the proximity sensor chip 100, around which an circuitry acting as a heat source is not disposed, so as to face a location where temperature will be measured.

According to the present invention, the internal temperature sensor 102 is disposed at a distal end portion of the IC, around which the circuitry acting as a heat source is not disposed.

Further, the structure in which the internal temperature sensor 102 is placed at the distal end of the IC toward the location where the temperature will be measured has an advantage in measurement.

Referring to FIG. 6 and FIG. 7, a method of operating the proximity sensor having the internal temperature sensor according to the present invention will now be described. The method according to the present invention is realized by a method of operating a proximity sensor provided with multiple channels reacting to user contact and a proximity sensor chip (IC) connected to the multiple channels through a sensing line and including an internal temperature sensor, which includes sensing a first sensing value through the multiple channels (S100); sensing a second sensing value through the internal temperature sensor (S200); and compensating the first sensing value through addition or subtraction of the second sensing value with respect to the first sensing value (S300).

The step of sensing a second sensing value (S200) includes: generating first clock signals variable according to temperature characteristics through a first oscillator of the internal temperature sensor (S210); generating second clock signals at time intervals set according to a setting condition corresponding to the first clock signal through a timer of the internal temperature sensor (S220); generating third clock signals independent of temperature change through a second oscillator of the internal temperature sensor, followed by counting the second clock signals using the third clock signals through the counter of the internal temperature sensor (S230); capturing a counted value with reference to the second clock signals to send the counted value through a buffer (S240), the counted value being obtained by counting the second clock signals; and outputting the value received from the buffer (S250).

The data value output in S250 may be the second sensing value.

Thus, according to the present invention, for multiple sensing channels, the proximity sensor chip (IC) including an internal temperature sensor is disposed near a reference-free channel to perform temperature compensation using the internal temperature sensor while allowing temperature compensation with respect to a distant channel using a reference channel, thereby enabling more accurate temperature compensation based only on external temperature data.

That is, in order to reduce influence on temperature by the interior of the IC while securing an advantage of measuring only the temperature change by the outside, the IC may be disposed at a location where there is no heat generation.

Further, according to the present invention, in a SET structure on which the proximity sensor chip IC is mounted near a heat source, the proximity sensor chip (IC) may realize internal compensation through temperature compensation using the internal temperature sensor disposed at the distal end portion of the proximity sensor chip IC, around which an circuitry acting as a heat source is not disposed.

Further, according to the present invention, the MCU is provided with a small ring oscillator, whereby resolution of the temperature sensor can be increased by implementing high resolution of ADC through adjustment in sensing time without significant increase in area of the temperature sensor.

Although some embodiments of the proximity sensor including an internal temperature sensor according to the present invention have been described herein, it will be understood that various modifications, changes, and alterations can be made by those skilled in the art without departing from the spirit and scope of the invention.

Therefore, the scope of the present invention should be defined by the appended claims and equivalents thereto, rather than limited to the foregoing embodiments.

That is, it will be understood that the foregoing embodiments are provided for illustration only and are not to be in any way construed as limiting the present invention, that the scope of the present invention is defined by the appended claims rather than the detailed description herein, and that the appended claims and equivalents thereto are intended to cover such modifications, changes, and alterations as would fall within the scope and spirit of the invention.

List of Reference Numerals
10: First sensing channel
20: Second sensing channel
50: Electronic device having an RF function
100: Proximity sensor chip (IC: Integrated Circuit)
101: Sensing Line
102: Internal temperature sensor
110: Clock signal generator
111: First oscillator
112: Current trimming DAC (Digital-to-Analog Converter)
150: Temperature compensator
151: Timer (Basic Interval Timer)
155: Second oscillator
156: Counter
157: Capture buffer
158: Timer data collector
200: Reference
201: Reference sensing line

What is claimed is:

1. A method of operating a proximity sensor provided with multiple channels reacting to user contact and a proximity sensor chip (IC) connected to the multiple channels through a sensing line and including an internal temperature sensor, the method comprising the steps of:
sensing a first sensing value through the multiple channels;
sensing a second sensing value through the internal temperature sensor; and
compensating the first sensing value through addition or subtraction of the second sensing value with respect to the first sensing value,
wherein the step of sensing a second sensing value comprises:
generating first clock signals variable according to temperature characteristics through a first oscillator of the internal temperature sensor;
generating second clock signals at time intervals set according to a setting condition corresponding to the first clock signals through a timer of the internal temperature sensor;
generating third clock signals independent of temperature change through a second oscillator of the internal temperature sensor, followed by counting the second clock signals using the third clock signals through a counter of the internal temperature sensor;
capturing a counted value with reference to the second clock signals to send the counted value through a buffer, the counted value being obtained by counting the second clock signals; and
outputting the value received from the buffer, and the output value is the second sensing value.

2. A proximity sensor provided with multiple channels reacting to user contact and a proximity sensor chip (IC) connected to the multiple channels through a sensing line,
wherein the proximity sensor chip (IC) comprises an internal temperature sensor, senses a first sensing value through the multiple channels, senses a second sensing value through the internal temperature sensor, and compensates the first sensing value through addition or subtraction of the second sensing value with respect to the first sensing value; and
wherein the internal temperature sensor comprises: a clock signal generator comprising a first oscillator and generating first clock signals variable according to temperature characteristics; and a temperature compensator generating second clock signals according to a setting condition corresponding to the first clock signals generated from the clock signal generator and outputting the second sensing value by counting the second clock signals through a second oscillator generating reference clock signals independent of temperature change.

3. The proximity sensor according to claim 2, wherein the first oscillator is a ring oscillator.

4. The proximity sensor according to claim 2, wherein a frequency of the first clock signals generated from the first oscillator increases upon relative increase in sensed temperature and decreases upon relative decrease in sensed temperature.

5. The proximity sensor according to claim 2, wherein the clock signal generator further comprises a current trimming DAC to adjust a frequency of the first clock signal generated from the first oscillator according to the quantity of electric current through the current trimming DAC.

6. The proximity sensor according to claim 2, wherein the temperature compensator comprises: a timer outputting the second clock signals at various time intervals according to the setting condition corresponding to the first clock signals generated from the first oscillator; a counter counting the second clock signals using third clock signals generated through the second oscillator to output a counted value; a capture buffer capturing the counted value output through the counter with reference to the second clock signals to send the counted value; and a timer data collector collecting the value captured by the capture buffer, and performs temperature compensation based on a value output through the timer data collector.

7. The proximity sensor according to claim 2, wherein one of the multiple channels is provided with a reference to perform temperature compensation and the proximity sensor chip (IC) comprising the internal temperature sensor is disposed near a channel not provided with the reference to perform temperature compensation.

8. The proximity sensor according to claim 7, wherein the internal temperature sensor is disposed at a distal end portion of the proximity sensor chip (IC), around which an circuitry acting as a heat source is not disposed, so as to face a location where temperature will be measured.

9. The proximity sensor according to claim 7, wherein a sensing value of the proximity sensor compensated through the internal temperature sensor is further compensated for an environmental change through the reference.

* * * * *